United States Patent
Lee et al.

(10) Patent No.: US 11,437,475 B2
(45) Date of Patent: Sep. 6, 2022

(54) SPLIT-GATE FLASH MEMORY CELL AND FABRICATION METHOD THEREOF

(71) Applicant: UNITED MICROELECTRONICS CORP., Hsin-Chu (TW)

(72) Inventors: Chih-Haw Lee, Hsinchu County (TW); Tzu-Ping Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/178,269

(22) Filed: Feb. 18, 2021

(65) Prior Publication Data
US 2022/0216311 A1 Jul. 7, 2022

(30) Foreign Application Priority Data
Jan. 7, 2021 (CN) .......................... 202110019031.1

(51) Int. Cl.
| | | |
|---|---|---|
| H01L 21/28 | (2006.01) | |
| H01L 29/788 | (2006.01) | |
| H01L 21/32 | (2006.01) | |
| H01L 21/321 | (2006.01) | |
| H01L 29/423 | (2006.01) | |
| H01L 29/66 | (2006.01) | |
| H01L 21/3213 | (2006.01) | |
| H01L 21/311 | (2006.01) | |

(52) U.S. Cl.
CPC ... *H01L 29/40114* (2019.08); *H01L 21/31111* (2013.01); *H01L 21/32* (2013.01); *H01L 21/32105* (2013.01); *H01L 21/32133* (2013.01); *H01L 29/42328* (2013.01); *H01L 29/66825* (2013.01); *H01L 29/7883* (2013.01)

(58) Field of Classification Search
None
See application file for complete search history.

(56) References Cited

U.S. PATENT DOCUMENTS

| | | | |
|---|---|---|---|
| 7,297,598 B2 | 11/2007 | Liu | |
| 10,468,538 B1* | 11/2019 | Lee | ........... H01L 21/7685 |
| 2004/0203205 A1* | 10/2004 | Liu | ........... H01L 29/40114 |
| | | | 438/257 |
| 2017/0170303 A1* | 6/2017 | Wong | ........... H01L 21/0217 |
| 2019/0181148 A1 | 6/2019 | Kumar | |
| 2020/0176609 A1 | 6/2020 | Kumar | |

FOREIGN PATENT DOCUMENTS

| | | |
|---|---|---|
| CN | 111384056 | 7/2020 |
| KR | 10-2006-0113121 | 11/2006 |

* cited by examiner

*Primary Examiner* — Xiaoming Liu
(74) *Attorney, Agent, or Firm* — Winston Hsu

(57) ABSTRACT

A split-gate flash memory cell includes a semiconductor substrate having thereon a select gate oxide layer and a floating gate oxide layer. A floating gate is disposed on the floating gate oxide layer. A football-shaped oxide layer is disposed on the floating gate. The floating gate includes tips under the football-shaped oxide layer. A select gate is disposed on the select gate oxide layer and extended onto the football-shaped oxide layer. An inter-poly oxide layer is between the select gate and the floating gate. The inter-poly oxide layer has a thickness smaller than a thickness of the select gate oxide layer. A source region is formed in the semiconductor substrate and adjacent to the floating gate. A drain region is formed in the semiconductor substrate and adjacent to the select gate.

16 Claims, 4 Drawing Sheets

SPLIT-GATE FLASH MEMORY CELL AND FABRICATION METHOD THEREOF

BACKGROUND OF THE INVENTION

1. Field of the Invention

The present invention relates to the field of semiconductor technology, and particularly relates to an improved split-gate flash memory device and a manufacturing method thereof.

2. Description of the Prior Art

It is known that the erasing operation of a split-gate flash memory cell is completed by the Fowler-Nordheim (FN) tunneling through the tip of the polysilicon floating gate (FG) to the polysilicon select gate (WL). The tip of the polysilicon floating gate has a higher electric field to the polysilicon select gate than the planar structure, so better erasing efficiency can be achieved.

The existing split-gate flash memory cell can usually pass the endurance test of 20,000 erase write cycles, but it is difficult to pass the endurance test of 100,000 erase write cycles. Therefore, the technical field still needs an improved split-gate flash memory device and its manufacturing method, which can overcome the shortcomings of the prior art.

SUMMARY OF THE INVENTION

It is one object of the present invention to provide an improved split-gate flash memory device and a manufacturing method thereof to solve the above-mentioned shortcomings or deficiencies of the prior art.

One aspect of the invention provides a method for forming a split-gate flash memory cell. A semiconductor substrate is provided. The semiconductor substrate has thereon a first oxide layer on a main surface of the semiconductor substrate, a polysilicon layer on the first oxide layer, and a hard mask layer on the polysilicon layer. The first oxide layer has a first thickness. The hard mask layer is patterned form an opening in the hard mask layer. A portion of the polysilicon layer exposed by the opening in the hard mask layer is oxidized to form a football-shaped oxide layer. The hard mask layer is then removed. The polysilicon layer not covered by the football-shaped oxide layer is etched, thereby forming a floating gate with tips under the football-shaped oxide layer. The first oxide layer is partially etched such that a remaining oxide layer having a remaining thickness is formed on the semiconductor substrate. A second oxide layer is formed to conformally cover the remaining oxide layer, a sidewall of the floating gate, and a top surface of the football-shaped oxide layer. The second oxide layer has a second thickness. An oxidation process is performed to form a third oxide layer having a third thickness on the sidewall of the floating gate, and a fourth oxide layer having a fourth thickness on the semiconductor substrate by oxidizing the second oxide layer and the remaining oxide layer. The fourth thickness is greater than the third thickness. A select gate is formed on the third oxide layer and on the fourth oxide layer. The select gate extends onto the football-shaped oxide layer. A source region and a drain region are formed in the semiconductor substrate.

According to some embodiments, the first thickness is less than 100 angstroms, for example, between 70-100 angstroms.

According to some embodiments, the remaining thickness is less than 70 angstroms, for example, between 20-70 angstroms.

According to some embodiments, the second thickness is less than 180 angstroms, for example, between 120-180 angstroms.

According to some embodiments, the third thickness is less than 190 angstroms, for example, between 130-190 angstroms.

According to some embodiments, the fourth thickness is less than 200 angstroms, for example, between 140-200 angstroms.

According to some embodiments, after forming the second oxide layer conformally covering the first oxide layer, the sidewall of the floating gate, and the top surface of the football-shaped oxide layer, the method further comprises: forming a spacer on the second oxide layer at a lower corner of the floating gate.

According to some embodiments, the steps of forming a spacer on the second oxide layer at a lower corner of the floating gate comprise: conformally depositing a spacer material layer on the second oxide layer; and anisotropically etching the spacer material layer.

According to some embodiments, the spacer material layer comprises a silicon nitride layer.

According to some embodiments, the hard mask layer comprises a silicon nitride layer.

Another aspect of the invention provides a split-gate flash memory cell including a semiconductor substrate having thereon a select gate oxide layer and a floating gate oxide layer; a floating gate disposed on the floating gate oxide layer; a football-shaped oxide layer disposed on the floating gate, wherein the floating gate comprises tips under the football-shaped oxide layer; a select gate disposed on the select gate oxide layer and extended onto the football-shaped oxide layer; an inter-gate layer between the select gate and the floating gate, wherein the inter-gate layer has a thickness that is smaller than a thickness of the select gate oxide layer; a source region in the semiconductor substrate and adjacent to the floating gate; and a drain region in the semiconductor substrate and adjacent to the select gate.

According to some embodiments, the thickness of the floating gate oxide layer is less than 100 angstroms, for example, between 70 and 100 angstroms.

According to some embodiments, the thickness of the select gate oxide layer is less than 200 angstroms, for example, between 140-200 angstroms.

According to some embodiments, the thickness of the inter-gate layer is less than 190 angstroms, for example, between 130-190 angstroms.

According to some embodiments, the split-gate flash memory cell further includes a spacer disposed on the inter-gate layer at the lower corner of the floating gate.

According to some embodiments, the spacer is a silicon nitride spacer.

According to some embodiments, the inter-gate layer isolates the select gate from the floating gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
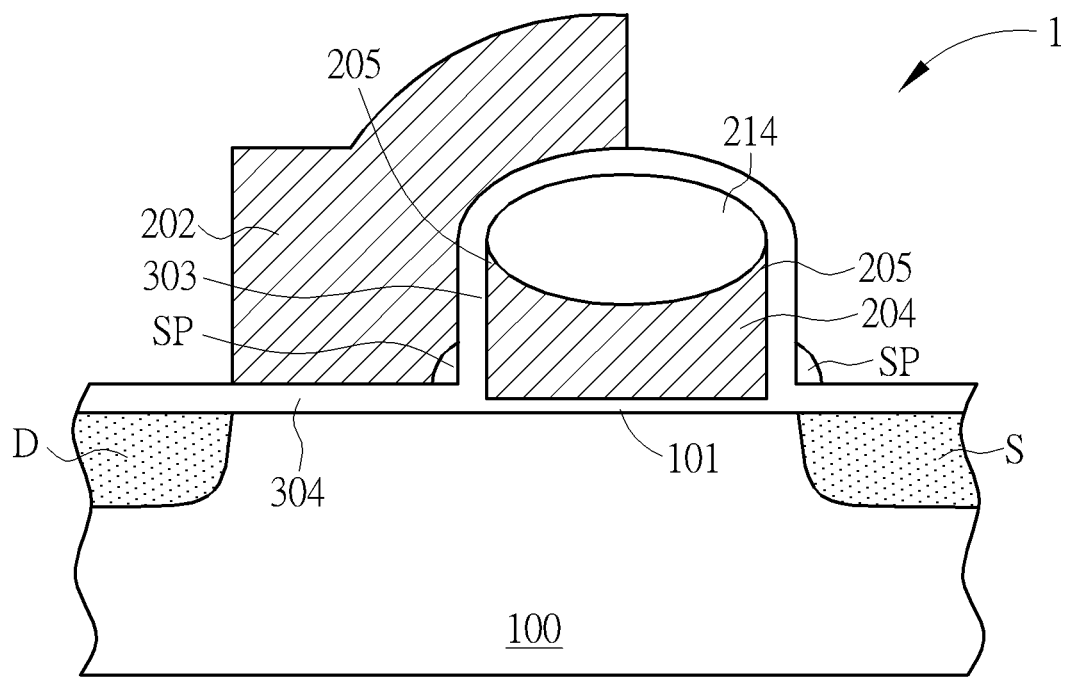
FIG. 1 is a schematic cross-sectional view of a split-gate flash memory cell according to an embodiment of the invention.

Please refer to FIG. 1, which is a schematic cross-sectional view of a split-gate flash memory cell according to an embodiment of the present invention. As shown in FIG. 1, the split-gate flash memory cell 1 comprises a semiconductor substrate 100, for example, a silicon substrate, on which a select gate oxide layer 304 and a floating gate oxide layer 101 are provided. According to an embodiment of the present invention, for example, the select gate oxide layer 304 and the floating gate oxide layer 101 may be silicon oxide layers, but are not limited thereto. On the floating gate oxide layer 101, a floating gate 204 is provided. On the floating gate 204, a football-shaped oxide layer 214 is disposed, wherein the floating gate 204 includes a tip 205 under the football-shaped oxide layer 214.

According to an embodiment of the present invention, a select gate 202 is disposed on the select gate oxide layer 304, and the select gate 202 is extended to the football-shaped oxide layer 214. According to an embodiment of the present invention, for example, the select gate 202 and the floating gate 204 may be polysilicon layers, but are not limited thereto. According to an embodiment of the present invention, for example, the football-shaped oxide layer 214 may be a silicon oxide layer, but is not limited thereto.

According to an embodiment of the present invention, an inter-gate layer 303 is provided between the select gate 202 and the floating gate 204. According to an embodiment of the present invention, the inter-gate layer 303 is an insulating layer, for example, a silicon oxide layer. According to an embodiment of the present invention, the thickness of the inter-gate layer 303 is smaller than the thickness of the select gate oxide layer 304. According to an embodiment of the present invention, the inter-gate layer 303 electrically separates the select gate 202 and the floating gate 204.

According to an embodiment of the present invention, the split-gate flash memory cell 1 further includes a source region S disposed in the semiconductor substrate 100 and adjacent to the floating gate 204. According to an embodiment of the present invention, the split-gate flash memory cell 1 further includes a drain region D, which is disposed in the semiconductor substrate 100 and is adjacent to the select gate 202. According to an embodiment of the present invention, for example, the semiconductor substrate 100 may be a P-type silicon substrate, but is not limited thereto. According to an embodiment of the present invention, for example, the source region S and the drain region D may be N-type doped regions, but are not limited thereto.

According to an embodiment of the present invention, for example, the thickness of the floating gate oxide layer 101 is preferably greater than 0 angstroms and less than 100 angstroms, and more preferably about 70-100 angstroms. According to an embodiment of the present invention, for example, the thickness of the select gate oxide layer 304 is preferably greater than 0 angstroms and less than 200 angstroms, and more preferably about 140-200 angstroms. According to an embodiment of the present invention, for example, the thickness of the inter-gate layer 303 is preferably greater than 0 angstroms and less than 190 angstroms, and more preferably about 130-190 angstroms.

According to an embodiment of the present invention, the split-gate flash memory cell 1 further includes a spacer SP disposed on the inter-gate layer 303 at the lower corner of the floating gate 204. According to an embodiment of the present invention, for example, the spacer SP may be a silicon nitride spacer, but is not limited thereto.

One advantage of the present invention is that the thickness of the inter-gate layer 303 is reduced to between 130-190 angstroms, so that the electric field between the select gate (word line) and the floating gate can be increased, whereby the erase efficiency can be improved. For example, the split-gate flash memory cell 1 can have a lower forward tunneling voltage (FTV) and a higher read current (Ir1). In addition, while reducing the thickness of the inter-gate layer 303, the thickness of the select gate oxide layer 304 is not sacrificed. For example, the thickness of the select gate oxide layer 304 can be maintained at 140-200 angstroms to meet high voltage operation requirements.

Please refer to FIG. 2 to FIG. 8, which are schematic diagrams of a method for forming a split-gate flash memory cell according to an embodiment of the present invention, wherein the same or similar regions, layers or elements are still represented by the same numeral numbers or labels.

Figure 2:
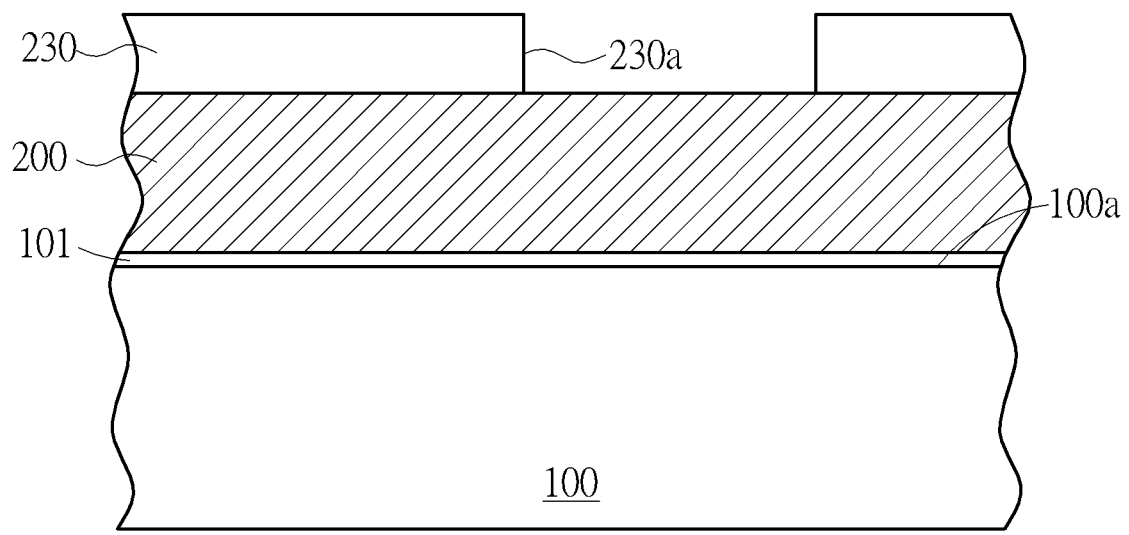
FIG. 2 to FIG. 8 are schematic diagrams illustrating a method of forming a split-gate flash memory cell according to an embodiment of the present invention.

As shown in FIG. 2, first, a semiconductor substrate 100 is provided with a first oxide layer (floating gate oxide layer) 101 on the main surface 100a of the semiconductor substrate 100, a polysilicon layer 200 on the first oxide layer 101, and a hard mask layer 230 on the polysilicon layer 200. According to an embodiment of the present invention, the hard mask layer 230 includes a silicon nitride layer. According to an embodiment of the present invention, the first oxide layer 101, for example, a silicon oxide layer has a first thickness. According to an embodiment of the present invention, for example, the first thickness is preferably greater than 0 angstroms and less than 100 angstroms, and more preferably about 70-100 angstroms. Next, the hard mask layer 230 is patterned, for example, by using an optical lithography and etching process to form an opening 230a in the hard mask layer 230. The polysilicon layer 200 is partially exposed by the opening 230a of the hard mask layer 230.

According to an embodiment of the present invention, the above-mentioned optical lithography process may include the steps of photoresist coating, baking, exposure, and development. According to an embodiment of the present invention, the above-mentioned etching process may include dry etching or wet etching. Since the above-mentioned optical lithography and etching process are well-known technologies, the details thereof will not be repeated.

Figure 3:
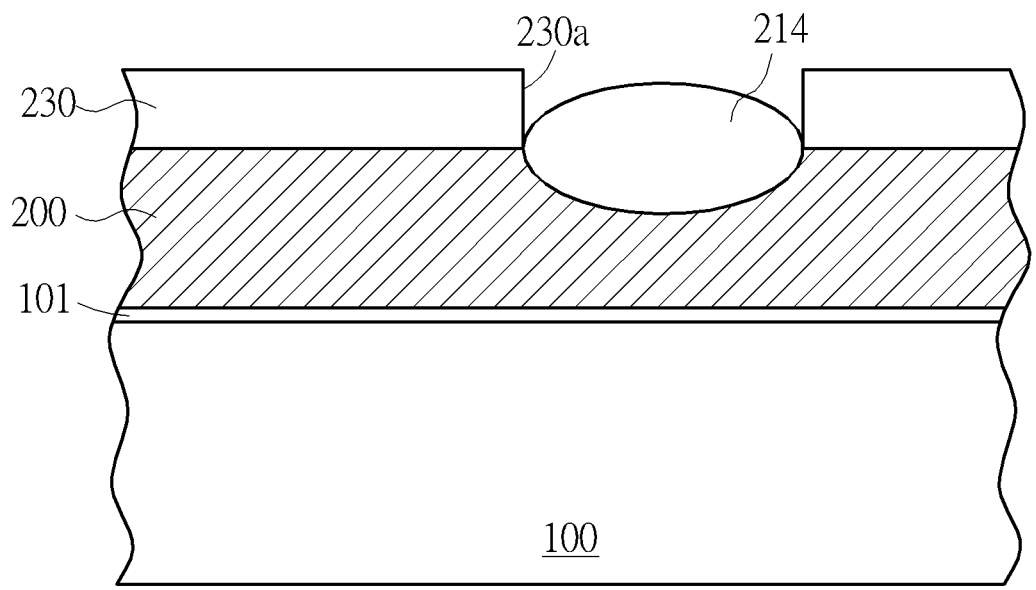

As shown in FIG. 3, an oxidation step is performed to oxidize the portion of the polysilicon layer 200 exposed by the opening 230a of the hard mask layer 230 into a football-like oxide layer 214.

Figure 4:
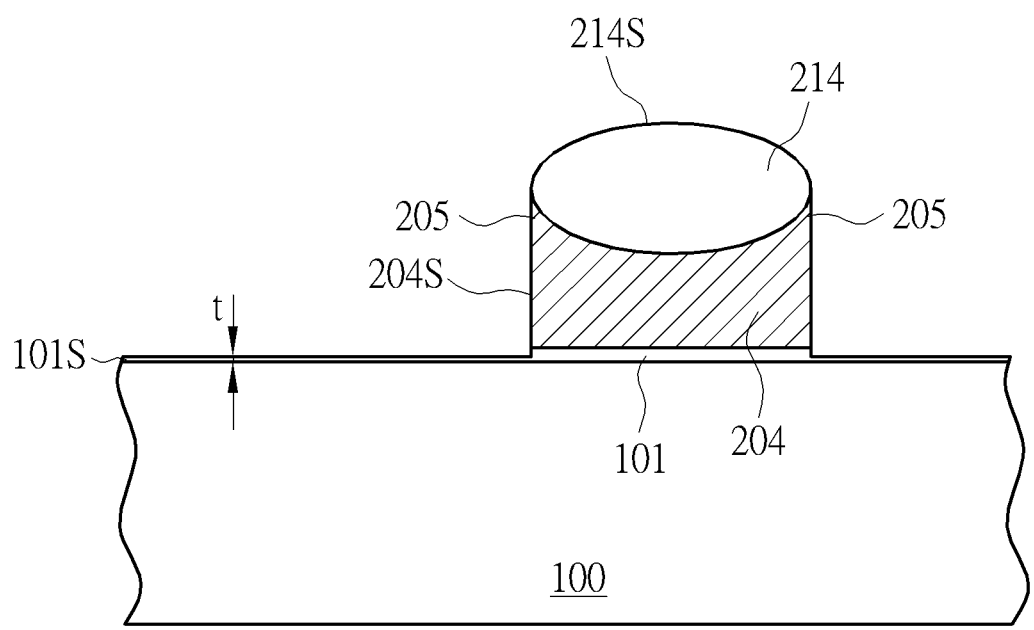

As shown in FIG. 4, the hard mask layer 230 is then removed. Then, the polysilicon layer 200 that is not covered by the football-shaped oxide layer 214 is etched, thereby forming a floating gate 204 with a tip 205 under the football-shaped oxide layer 214. According to an embodiment of the present invention, the floating gate 204 has approximately vertical sidewalls 204S. According to an embodiment of the present invention, the football-shaped oxide layer 214 may have a convex curved top surface 214S.

Subsequently, the first oxide layer 101 that is not covered by the floating gate 204 is partially etched, and a remaining oxide layer 101S with a remaining thickness t is formed on the semiconductor substrate 100. According to an embodiment of the present invention, for example, the remaining thickness t is greater than 0 angstroms and less than 70 angstroms, preferably, for example, about 20-70 angstroms, but is not limited thereto. According to an embodiment of the present invention, for example, the method of partially etching the first oxide layer 101 not covered by the floating gate 204 may utilize wet etching, for example, a diluted hydrofluoric acid (DHF) solution.

Figure 5:
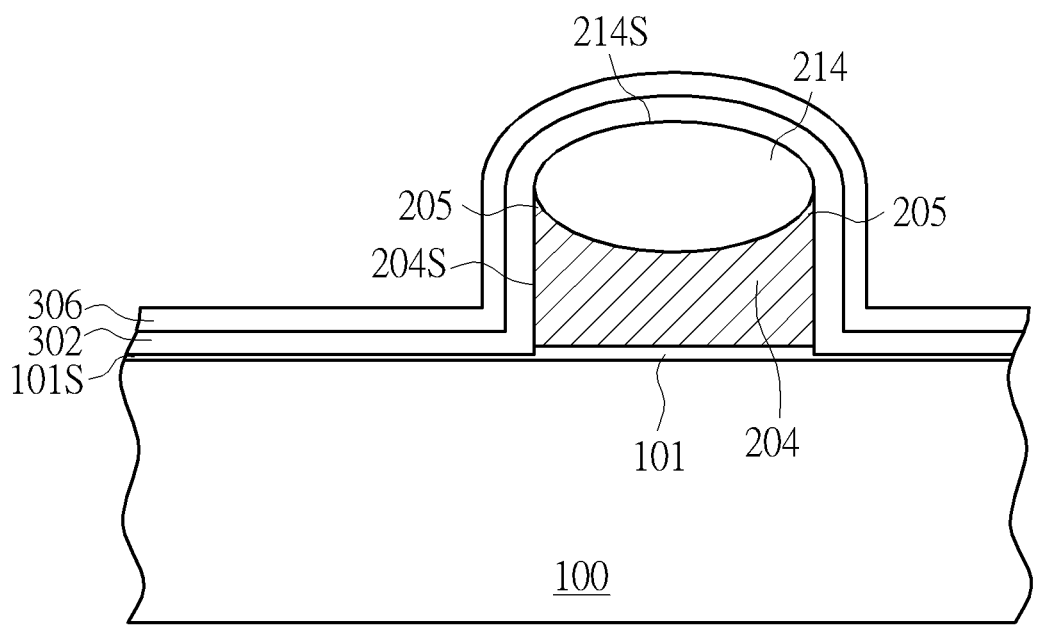

As shown in FIG. 5, a second oxide layer 302, for example, a silicon oxide layer, is then formed to conformally cover the remaining oxide layer 101S, the sidewall 204S of the floating gate 204, and the top surface 214S of the football-shaped oxide layer 214. Next, a spacer material layer 306, for example, a silicon nitride layer, is deposited conformally on the second oxide layer 302. According to an embodiment of the present invention, the second oxide layer 302 has a second thickness. According to an embodiment of the present invention, for example, the second thickness is preferably greater than 0 angstroms and less than 180 angstroms, and more preferably about 120-180 angstroms.

Figure 6:
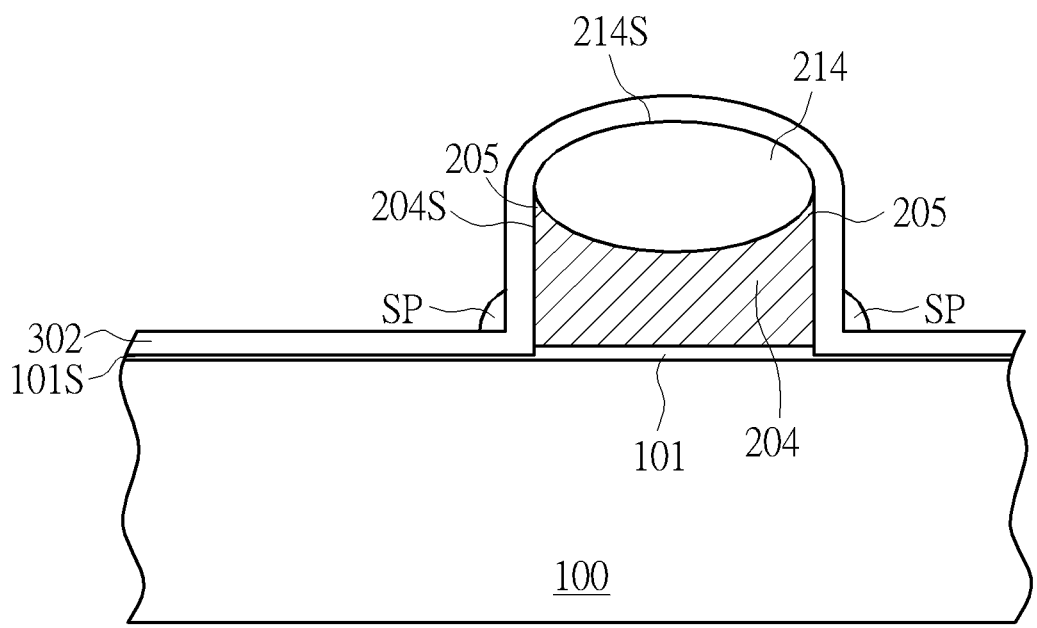

As shown in FIG. 6, an anisotropic dry etching process is then performed to selectively etch the spacer material layer 306 to form the spacer SP on the second oxide layer 302 at the lower corner of the floating gate 204.

Figure 7:
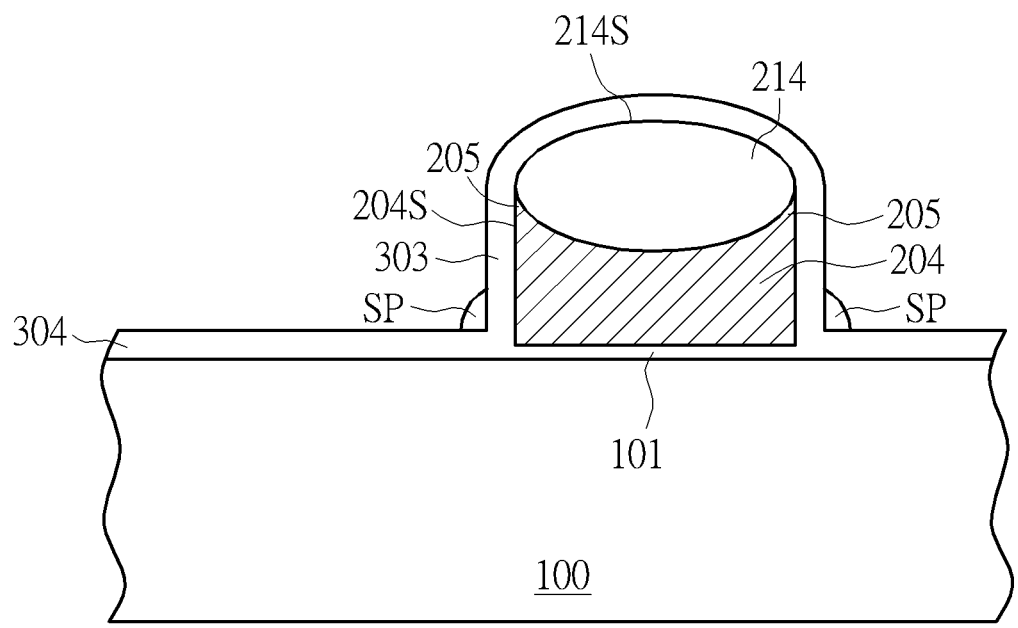

As shown in FIG. 7, an oxidation process is performed to form a third oxide layer (inter-gate layer) 303 with a third thickness on the sidewall 204S of the floating gate 204, and form a fourth oxide layer (select gate oxide layer) 304 with a fourth thickness by oxidizing the second oxide layer 302 and the remaining oxide layer 101S on the semiconductor substrate 100. According to an embodiment of the present invention, the fourth thickness is greater than the third thickness. According to an embodiment of the present invention, for example, the third thickness is preferably greater than 0 angstroms and less than 190 angstroms, and more preferably between 130-190 angstroms. According to an embodiment of the present invention, for example, the fourth thickness is preferably greater than 0 angstroms and less than 200 angstroms, and more preferably about 140-200 angstroms.

Figure 8:
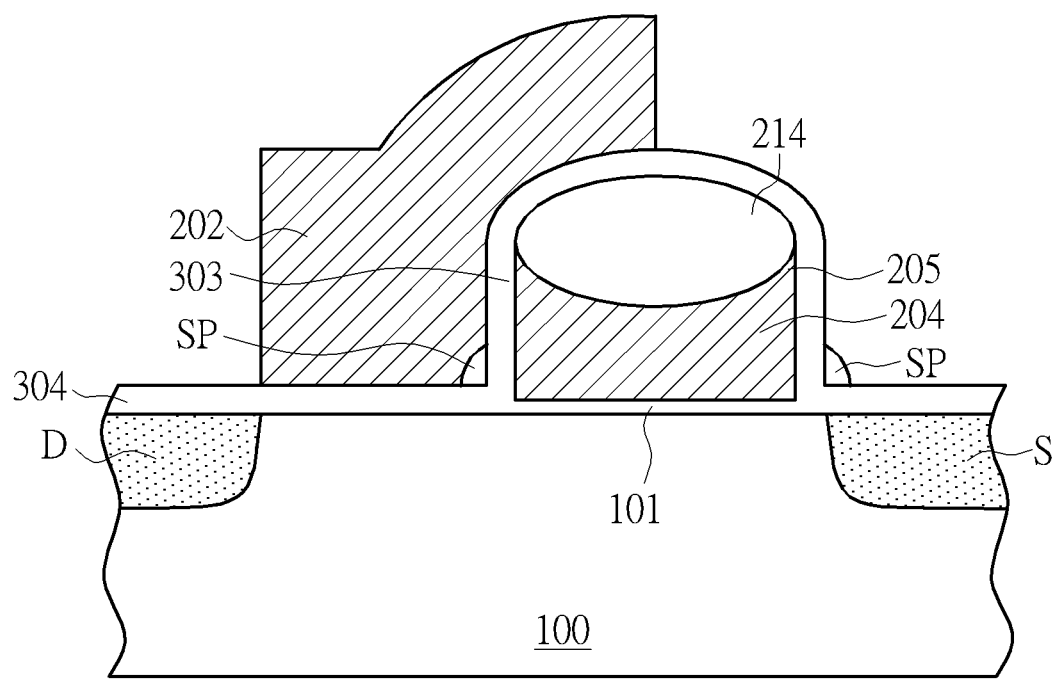

As shown in FIG. 8, a select gate 202 is formed on the third oxide layer 303 and the fourth oxide layer 304, wherein the select gate 202 extends to the football-shaped oxide layer 214. Finally, an ion implantation process is performed to form a source region S and a drain region D in the semiconductor substrate 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a split-gate flash memory cell, comprising:
   providing a semiconductor substrate having thereon a first oxide layer on a main surface of the semiconductor substrate, a polysilicon layer on the first oxide layer, and a hard mask layer on the polysilicon layer, wherein the first oxide layer has a first thickness;
   patterning the hard mask layer to form an opening in the hard mask layer;
   oxidizing a portion of the polysilicon layer exposed by the opening in the hard mask layer to form a football-shaped oxide layer;
   removing the hard mask layer;
   etching the polysilicon layer not covered by the football-shaped oxide layer, thereby forming a floating gate with tips under the football-shaped oxide layer;
   partially etching the first oxide layer such that a remaining oxide layer having a remaining thickness is formed on the semiconductor substrate;
   forming a second oxide layer conformally covering the remaining oxide layer, a sidewall of the floating gate, and a top surface of the football-shaped oxide layer, wherein the second oxide layer has a second thickness;
   forming a spacer on the second oxide layer at a lower corner of the floating gate;
   performing an oxidation process to form a third oxide layer having a third thickness on the sidewall of the floating gate, and a fourth oxide layer having a fourth thickness on the semiconductor substrate by oxidizing the second oxide layer and the remaining oxide layer, wherein the fourth thickness is greater than the third thickness;
   forming a select gate on the third oxide layer and on the fourth oxide layer, wherein the select gate extends onto the football-shaped oxide layer, and the select gate is in direct contact with the spacer; and
   forming a source region and a drain region in the semiconductor substrate, wherein, after the oxidation process, the first oxide layer directly under the floating gate has a uniform thickness between two opposite sidewalls of the floating gate.

2. The method for forming a split-gate flash memory cell according to claim 1, wherein the first thickness is less than 100 angstroms.

3. The method for forming a split-gate flash memory cell according to claim 1, wherein the remaining thickness is less than 70 angstroms.

4. The method for forming a split-gate flash memory cell according to claim 1, wherein the second thickness is less than 180 angstroms.

5. The method for forming a split-gate flash memory cell according to claim 1, wherein the third thickness is less than 190 angstroms.

6. The method for forming a split-gate flash memory cell according to claim 1, wherein the fourth thickness is less than 200 angstroms.

7. The method for forming a split-gate flash memory cell according to claim 1, wherein said forming a spacer on the second oxide layer at a lower corner of the floating gate comprises:
   conformally depositing a spacer material layer on the second oxide layer; and
   anisotropically etching the spacer material layer.

8. The method for forming a split-gate flash memory cell according to claim 7, wherein the spacer material layer comprises a silicon nitride layer.

9. The method for forming a split-gate flash memory cell according to claim 1, wherein the hard mask layer comprises a silicon nitride layer.

10. A split-gate flash memory cell, comprising:
    a semiconductor substrate having thereon a select gate oxide layer and a floating gate oxide layer;

a floating gate disposed on the floating gate oxide layer;

a football-shaped oxide layer disposed on the floating gate, wherein the floating gate comprises tips under the football-shaped oxide layer;

a select gate disposed on the select gate oxide layer and extended onto the football-shaped oxide layer;

an inter-gate layer between the select gate and the floating gate, wherein the inter-gate layer has a thickness that is smaller than a thickness of the select gate oxide layer;

a spacer on the inter-gate layer at a lower corner of the floating gate, wherein the select gate is in direct contact with the spacer;

a source region in the semiconductor substrate and adjacent to the floating gate; and a drain region in the semiconductor substrate and adjacent to the select gate, wherein the floating gate oxide layer directly under the floating gate has a uniform thickness between two opposite sidewalls of the floating gate.

11. The split-gate flash memory cell according to claim 10, wherein the floating gate oxide layer has a thickness less than 100 angstroms.

12. The split-gate flash memory cell according to claim 10, wherein the select gate oxide layer has a thickness less than 200 angstroms.

13. The split-gate flash memory cell according to claim 10, wherein the semiconductor substrate is a silicon substrate, and wherein the select gate oxide layer and the floating gate oxide layer are silicon oxide layers.

14. The split-gate flash memory cell according to claim 10, wherein the football-shaped oxide layer is a silicon oxide layer, and wherein the inter-gate layer is a silicon oxide layer.

15. The split-gate flash memory cell according to claim 10, wherein the spacer comprises a silicon nitride layer.

16. The split-gate flash memory cell according to claim 10, wherein the select gate and the floating gate comprise polysilicon layers.

* * * * *